US007067355B2

(12) United States Patent
Haluzak et al.

(10) Patent No.: US 7,067,355 B2

(45) Date of Patent: Jun. 27, 2006

(54) PACKAGE HAVING BOND-SEALED UNDERBUMP

(75) Inventors: Charles C. Haluzak, Corvallis, OR (US); Martha A. Truninger, Corvallis, OR (US); Donald L. Michael, Monmouth, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 120 days.

(21) Appl. No.: 10/854,110

(22) Filed: May 26, 2004

(65) Prior Publication Data

US 2005/0275072 A1 Dec. 15, 2005

(51) Int. Cl.

*H01L 21/50* (2006.01)
*H01L 21/48* (2006.01)
*H01L 21/44* (2006.01)

(52) U.S. Cl. ...................... 438/116; 257/680; 257/433; 257/704

(58) Field of Classification Search ................ 438/116
See application file for complete search history.

(56) References Cited

U.S. PATENT DOCUMENTS 4,001,629 A * 1/1977 Thayer ....................... 313/517
5,783,340 A 7/1998 Farino et al.
6,391,673 B1 5/2002 Ha et al.
6,400,009 B1 6/2002 Bishop et al.
6,436,853 B1 8/2002 Lin et al.
6,479,311 B1 11/2002 Scharf et al.
6,479,315 B1 11/2002 Zosel et al.
6,506,620 B1 1/2003 Scharf et al.
6,569,701 B1 5/2003 Knieser et al.
2001/0021570 A1 9/2001 Lin et al.
2002/0179921 A1 12/2002 Cohn
2003/0036215 A1 2/2003 Reid
2005/0180701 A1* 8/2005 Steinberg et al. ............. 385/92
2005/0184304 A1* 8/2005 Gupta et al. .................. 257/98

OTHER PUBLICATIONS

MSDS for CYCLOTENE® 4026-46 Advanced Electronics Resin, The Dow Chemical Company, Midland, MI, 10 pages, Nov. 20, 2001.

MSDS for CYCLOTENE® 4022-35 Advanced Electronics Resin, The Dow Chemical Company, Midland, MI, 10 pages, Nov. 20, 2001.

Sammon, T., H. Schofield, A. Arzumanyan, and D. Kinzer, "A New Generation of Wafer Level Packaged HEXFET® Devices," International Rectifier, 4 pages, as presented at PCIM Europe 2000.

* cited by examiner

*Primary Examiner*—Tu-Tu Ho

(57) ABSTRACT

A package for containing microelectromechanical devices includes a first substrate wafer, and a second substrate wafer made of an optical quality material. An underbump is interposed between the first and second substrate wafers. The underbump is composed of a standoff region and a localized bond region. The first and second substrate wafers and the underbump define a chamber that contains at least one microelectronic device.

13 Claims, 8 Drawing Sheets

10 24 22 12 28 20 16 26 16 14 18 38 29 30 38' 18

10 4 20 18 17 16 22 14 26 24

PACKAGE HAVING BOND-SEALED UNDERBUMP

BACKGROUND

The present disclosure relates to processes and architectures for packaging electronic devices.

Various methods have been proposed for packaging of electronic devices, particularly microelectromechanical systems (MEMS) and optical microelectromechanical systems (micro-opto-electro-mechanical systems) (MOEMS). Current designs use various thicknesses of metals (e.g. gold-tin alloys) configured as a bond ring between silicon wafers and glass wafers.

Providing metal bond rings having thicknesses greater than a few microns may cause throughput issues in the normal fabrication operations if one component of assembly requires significantly longer time than another to complete, on a wafer-basis. Even where all of the layers in the bonding are sputter deposited metals on the order of less than 1 μm thick, issues of throughput may arise.

Additionally, under certain circumstances, metal bond rings may result in structural non-uniformities due, in part, to the soldering operation employed to achieve the bond between the respective glass and silicon substrates. Additionally, metal bond rings tend to have a coefficient of thermal expansion that may differ from the glass substrate. The mismatch in the coefficients of thermal expansion may cause stress at the glass-bond ring junction as a result of differences in expansion and contraction characteristics. Such anomalies may be undesirable in various electronic devices.

SUMMARY

The present invention substantially solves the drawbacks enumerated above by providing a microelectromechanical (MEMS) device package and method for making the same that is suitable for use with various electronic devices, integrated circuits, spatial light modulators, and display devices. The MEMS device package includes a first substrate wafer and a second substrate wafer. One of the substrate wafers (e.g. second substrate wafer) may be composed of at least one material having suitable optical quality. An underbump is interposed between the first and second substrate wafers. The underbump is composed of a standoff region and a localized bond region. The first and second substrate wafers and the underbump define a chamber where a microelectromechanical system device may be contained.

BRIEF DESCRIPTION OF THE DRAWINGS

Objects, features, and advantages of embodiments of the present invention will become apparent by reference to the following detailed description and drawings in which like reference numerals correspond to similar, though not necessarily identical, components. For the sake of brevity, reference numerals having a previously described function may not necessarily be described in connection with subsequent drawings in which they appear.

DETAILED DESCRIPTION

Figure 1:
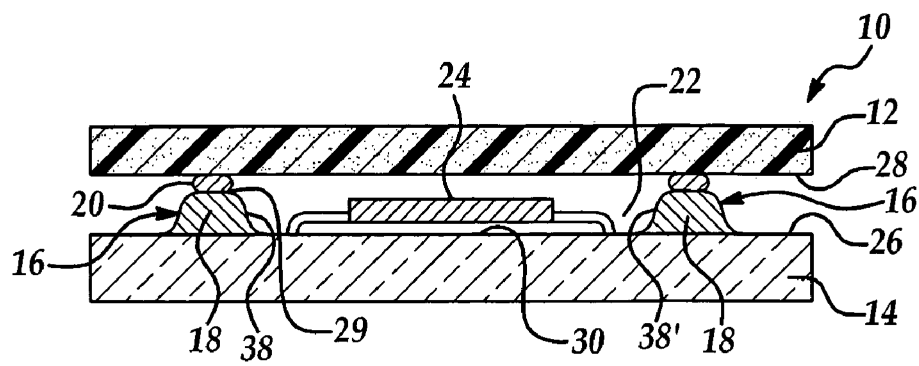
FIG. 1 is a cross-sectional view of an embodiment of the microelectromechanical device package.

The present invention is directed to packaging devices, particularly devices for packaging electronic devices therein. Non-limitative examples of electronic devices include microelectromechanical system (MEMS) devices. Current designs use various thicknesses of metals (e.g. gold-tin alloys) configured as a bond ring between silicon wafers and glass wafers. In order to establish the metal bond ring, electroplating of Au/Sn micro-stacks or screen-printing of solder pastes is typically used. However, the bond ring height from these processes is typically greater than about 10 μm. Such deposition techniques may not scale well with decreasing bond ring thickness. For bond ring thicknesses ranging between about 3 μm and about 10 μm, sputter deposition processes may be used. In some instances, however, sputter deposition may be slow and create challenges regarding wafer cost and throughput. Conventional sputtering and etching processes may result in wasted metal.

This processing difficulty may be compounded where device architecture requirements dictate bond ring thicknesses greater than a few microns but not thick enough to employ electroplating or solder paste deposition techniques. Solder pastes may, in some instances, pose an additional problem with regard to integrating MEMS devices. For example, a fluxing process (where acidic "flux" is used to remove metal oxides from the bonding metal layers generally prior to solder paste application) may be very difficult, if not substantially impossible to integrate with a design having an "open," or unpassivated, MEMS structure near the bonding ring. The flux may corrode the MEMS metal materials and/or may later become a source of particle or stiction (static friction) contamination.

In an embodiment, a chamber is formed between first and second substrate wafers by an underbump interposed between the substrate wafers. The chamber may be adapted to contain a functional fluid and/or at least one MEMS device in sealed relationship within the chamber. The MEMS device may be any suitable microelectromechanical system. Examples of MEMS devices include, but are not limited to, micro-opto-electromechanical systems (MOEMS), micro-gyroscopes, micro-accelerometers, resonant accelerometers, micromirrors, micromotors, micro-actuators, and the like.

In a further embodiment, the packaging device may include a fill port defined in the underbump such that the chamber is open to an exterior surface. The fill port offers the advantage of filling the chamber after the glass and silicon substrates have been bonded. The fill port may have a metallized inner surface and may be sealed with a suitable plug that is inserted in the fill port after the desired fluid has been introduced into the chamber.

The microelectromechanical device package 10 includes first and second substrates/substrate wafers 12, 14 with an underbump 16 (also referred to herein as a structure) interposed therebetween. The underbump 16 may include a standoff region 18 and a localized bond region 20 in overlying relationship to the standoff region 18. The localized bond region 20 may include a high temperature bond material capable of bonding to both the standoff region 18 and one of the first and second substrate wafers 12, 14 (depending upon on which substrate 12, 14 the underbump 16 is fabricated). The underbump 16 and the first and second substrate wafers 12, 14 define a chamber 22. The chamber 22 may have any suitable size and/or configuration to contain at least one microelectromechanical system (MEMS) device 24, a functional fluid and/or a gas therein. In one embodiment, the functional fluid contained in the chamber 22 may be adapted to be polarized by an applied voltage.

The first and second substrates/substrate wafers 12, 14 may be formed of suitable materials. Suitable substrate/wafer materials include, but are not limited to, silicon and various materials that may support CMOS architectures as well as other architectures known to the skilled artisan. It is contemplated that at least one of the first and second substrate wafers 12, 14 may be composed of an optical quality material. As used herein, the term "optical quality" is defined as a material having a suitable light transmissivity, reflectivity characteristics, or the like when employed in the associated device. Examples of suitable materials include, but not be limited to, TEOS, silicate, polycarbonate, magnesium fluoride, and quartz. Light transmissivity may also include the capacity to permit generated light to pass into chamber 22 and/or the capacity to permit reflected light or produced light to pass out of chamber 22. Light may include light in the visible and nonvisible spectra as well as discrete portions thereof. The degree of transmissivity of the optical quality material is that which permits device function without undue impedance.

In a non-limitative example, the first or second substrate wafer 12, 14 is made of an optical quality material and the other substrate wafer 14, 12 is made of a suitable semiconductor substrate material.

The underbump 16 includes a standoff region 18 and localized bond region 20. It is to be understood that the underbump 16 may be formed on or defined in one of the first and second substrate wafers 12, 14. In the embodiment as depicted in FIG. 1, standoff region 18 of the underbump is supported on an upper inwardly oriented face 26 of the second substrate wafer 14. It is also contemplated that, where appropriate, the standoff region 18 may be supported on the inwardly oriented face 28 of first substrate wafer 12.

The standoff region 18 may be composed of any suitable material capable of being selectively established on first and second substrate wafers 12, 14. It is to be understood that the material used for the standoff region 18 may in some embodiment(s) also have a higher melting temperature than the material used for the localized bond region 20 such that the standoff region 18 acts as a standoff material that will not melt upon subsequent soldering and/or heating of the localized bond region 20. Suitable materials include, but are not limited to, at least one of silica glass, phosphosilicate, borosilicate glass, titanium silicate glass, polysilazane, tetraethylorthosilicate glass, polysilicon, metal-organic spin-on coatings, nickel and copper. Metal-organic spin-on coatings may include metal-organic containing polymers such as acrylates, epoxies, polycarbonates, and polyimides. Additional spin-on-coatings may include silicone based materials having processing temperatures within fabrication parameters for the associated assembly. It is also contemplated that the standoff region 18 may include suitable photoimagable materials including, but not limited to benzocyclobutene-based polymer dielectrics.

In an embodiment as disclosed herein, it is contemplated that underbump 16 is established on an upper inwardly oriented surface 26 of second substrate wafer 14. In this embodiment, the second substrate wafer 14 may be composed of a suitable optical quality material, such as optical quality glass. The standoff region 18 of underbump 16 may be composed of a material possessing appropriate dielectric properties compatible with the material of the second substrate wafer 14. It is to be understood that the material of choice may be one capable of selective deposition and/or suitable configuration subsequent to deposition.

In an embodiment, where desired or required, suitable layers or materials. (not shown) may be interposed between the upper inwardly oriented surface 26 of second substrate wafer 14 and the standoff region 18 of underbump 16. It is contemplated that suitable materials include those that do not adversely interfere with the function or performance of the underbump 16 in the MEMS device package 10.

As depicted in FIG. 1, the underbump 16 may also have a localized bond region 20 interposed between a distal surface 29 of standoff region 18 and the inwardly oriented surface 28 of first substrate wafer 12. In the finished package 10, it is contemplated that the localized bond region 20 may provide sufficient bonding or adhesion to the region of the first substrate wafer 12 proximate thereto, in order to provide sealing contact between underbump 16 and the first substrate wafer 12.

The localized bond region 20 may be composed of one or more materials (bond material layer(s) and/or adhesion layer(s)) that may be selectively established relative to the standoff region 18 and may achieve bonding by a suitable process such as anodic bonding or soldering. Non-limitative examples of such anodic bonding materials include electroconductive materials such as various depositable metals and metal alloys. Suitable soldering materials may include metal materials capable of melting with the application of localized elevated temperatures such as solders. Suitable metals include, but are not limited to, nickel, gold, and/or tin. Similarly, alloys of such materials may be employed in the localized bond region 20. It is to be understood that the localized bond region 20 may be a localized high-temperature bond region.

Figure 2:
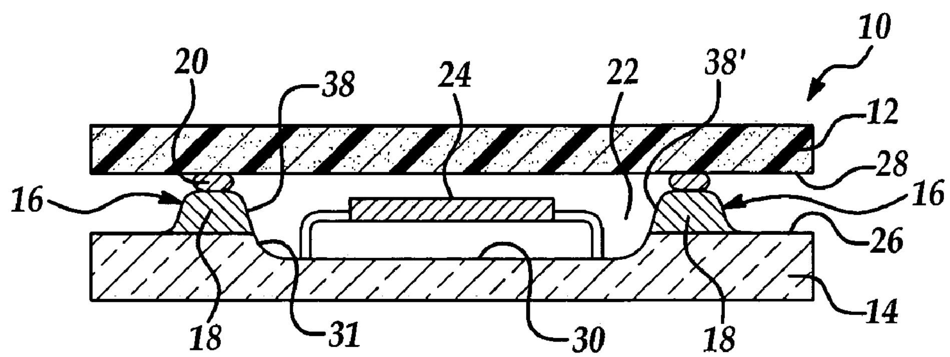
FIG. 2 is a cross-sectional view of an alternate embodiment of the microelectromechanical device package.

The underbump 16 may have any suitable cross-sectional configuration appropriate for supporting first and second substrate wafers 12, 14 in spaced relationship from one another. As depicted in FIGS. 1 and 2, the underbump 16 may have a slightly frustoconical cross-sectional configuration. However, it is to be understood that more rectilinear cross-sections may be advantageously employed. The underbump 16 may have a sufficient width to provide appropriate sealing contact between the underbump 16 and the associated substrate wafer 12, 14. The height of the underbump 16 may be any height sufficient to contain the appropriate MEMS device 24 in functional relationship in the defined chamber 22. Thus, it is contemplated that the underbump 16 will have a height, as measured from inwardly oriented face 26 of second substrate wafer 14, that is greater than about 2.5 μm. The maximum height of the underbump 16 may be limited by various packaging and manufacturing considerations. Generally, the height will be less than about 25 μm, with underbump heights typically ranging between about 3 μm and about 20 μm.

The chamber 22 may be defined by an associated region of the inwardly oriented face 28 of first substrate wafer 12, the underbump 16, and the floor 30 of the second substrate wafer 14. The underbump 16 may define opposed walls 38, 38' of the chamber 22. As depicted in FIG. 1, the floor 30 may be essentially planar to the surrounding upper inwardly oriented face 26 of second substrate wafer 14. Alternately, as depicted in FIG. 2, floor 30 may be defined in a depression 31 defined in the second substrate wafer 14. It is to be understood that the depression 31 may be formed in either the first or second substrate wafer 12, 14. Still further, the depression 31 may also be bounded by the standoff region 18 or underbump 16.

The chamber 22 of the microelectromechanical device package 10 may include a suitable functional fluid or gas contained therein. Functional fluids or gases, as that term is used herein, refer to those fluids/gases that may be appropriate and/or advantageous to the function of the associated MEMS device 24.

The MEMS device 24 may be any suitable device. As used herein, the term microelectromechanical system is to be broadly construed as to include miniaturized and subminiaturized systems including but not limited to silicon-based mechanical devices, chemical and biological actuators, miniature non-silicon structures, etc. Such systems may include sensing, processing, and/or actuating functions. Non-limitative examples of such devices include micromirrors, Fabry-Perot devices, and the like. Other examples of microelectromechanical system devices 24 include, but are not limited to micro-opto-electro-mechanical system devices (MOEMS), microgyroscopes, microaccelerometers, resonant accelerometers, micromirrors, micromotors, and microactuators. The microelectromechanical system device 24 illustrated in FIGS. 1–2 is a schematic, generic depiction of a device for purposes of illustration and may be operatively connected to the first or second substrate wafer 12, 14. Generally, it may be preferable to operatively connect the MEMS device 24 to the substrate 12, 14 which is formed from silicon and various materials that may support CMOS architectures.

It is also contemplated that the chamber 22 may be sealed such that the chamber 22 possesses a vacuum or negative pressure. Additionally, where desired and/or required, it is contemplated that the seal achieved may be hermetic. Once again, such conditions are those that support the function or performance of the microelectromechanical device or system at large.

Figure 3:
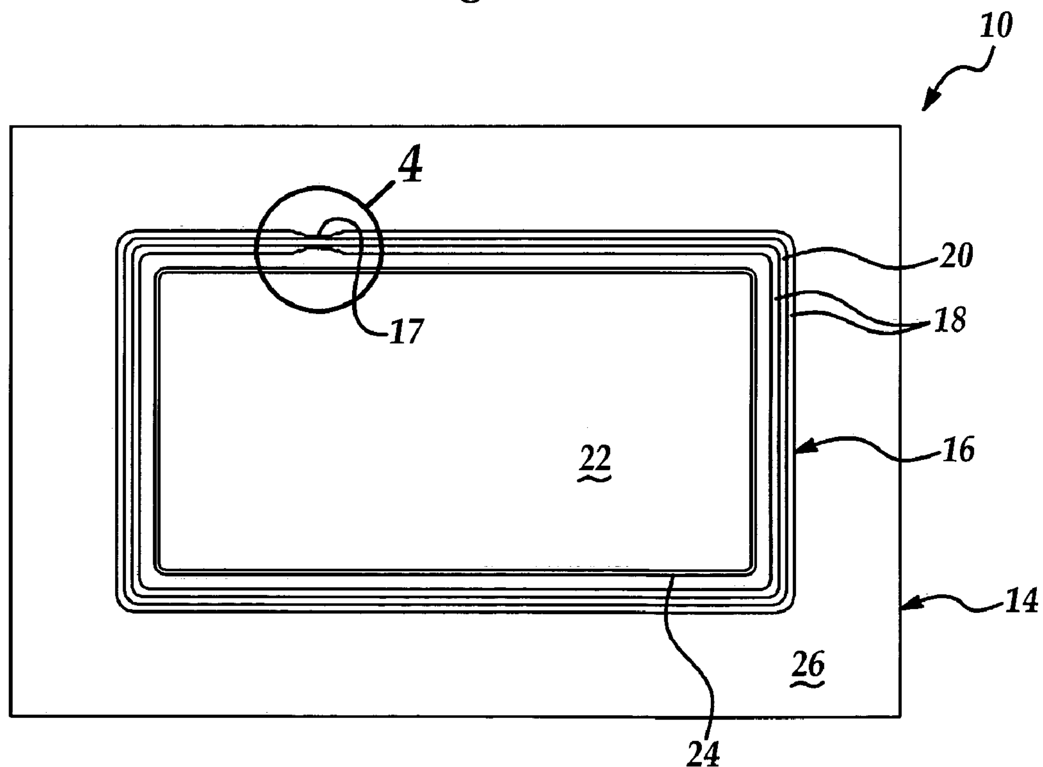
FIG. 3 is a top view of an embodiment of a second substrate wafer with an underbump.

Referring now to FIG. 3. the underbump 16 may have any suitable configuration, as previously described. In an embodiment, the underbump 16 is a continuous rectilinear structure defined on the second substrate wafer 14 in a manner that continuously surrounds the desired MEMS device 24. It is contemplated that the underbump 16 may have any suitable geometric configuration desired and/or required to define an appropriate chamber 22. Furthermore, the area of FIG. 3 defined by the circle and labeled "4" is generally the portion of the package 10 shown in FIGS. 4A and 4B, with the view in FIG. 3 having some layers (e.g., first substrate wafer 12) removed for clarity.

Figure 4A:
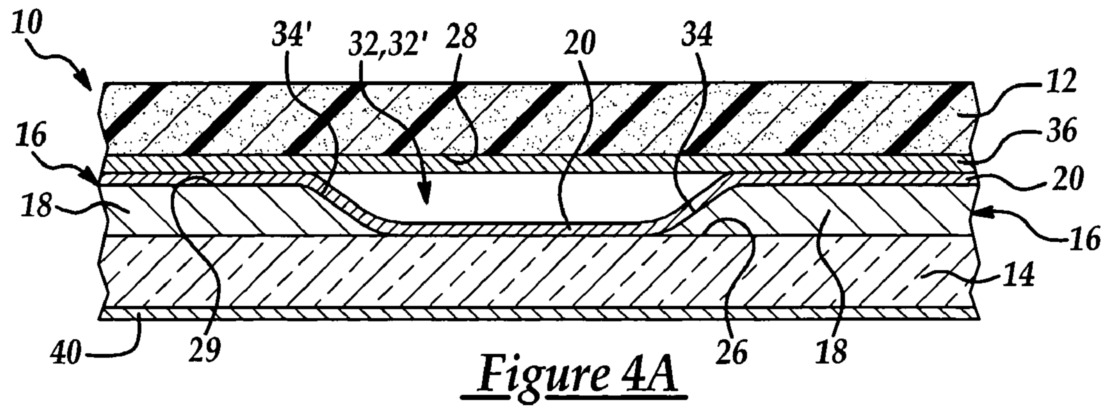
FIG. 4A is a cross-sectional view generally showing the area defined by the circle labeled "4" in FIG. 3, and further showing a fill port having an adhesion promoting surface and a first substrate wafer.
Figure 4B:
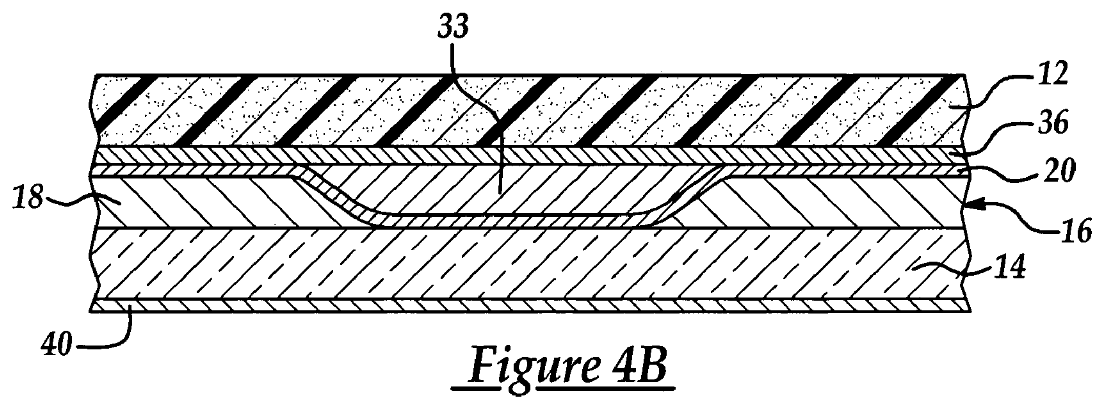
FIG. 4B is a cross-sectional view of the embodiment of FIG. 4A with a sealed fill port.

In an embodiment as depicted in FIGS. 3, 4A and 4B, the underbump 16 may further include at least one fill port 32 defined therein. Fill port 32 may be defined by a breach cut 32' having walls 34, 34' prepared in the standoff region 18 of the underbump 16. It is to be understood that the fill port 32 (breach cut 32') may extend from an exterior surface 17 of the underbump (shown in FIG. 3) to the chamber 22. This configuration may allow the package 10 to be substantially bonded (while leaving the fill port 32 open) before filling the chamber 22 with a desired liquid or gas. Upon filling the chamber 22 through the fill port 32, the fill port 32 may be sealed or plugged (as depicted in FIG. 4B).

The breach cut 32' may be established by any suitable method. For example, the underbump 16 may be masked by a suitable material (not shown), and the masked assembly may then be etched by a selective etch process that selectively stops on the material composing the second substrate wafer 14. It is to be understood that the selective etch process may occur before the localized bond region 20 is established on the standoff region 18. After the breach cut walls 34, 34' are formed, the masking material may be removed and the fabrication process (discussed further hereinbelow) may be continued.

In an embodiment in which the fill port 32 is formed, the localized bond region 20 may be composed of a suitable metallized or metallic material and may extend in an essentially continuous manner from the upper or distal surface 29 of the standoff region 18 of underbump 16 over breach cut walls 34, 34' to a region proximate to or in contact with the inwardly oriented surface 26 of second substrate wafer 14.

The resulting fill port 32 may have metallized surfaces on all sides. It is contemplated that a suitable plug 33 may be positioned in the fill port 32 when desired and/or required, as shown in FIG. 4B. The plug 33 may be capable of achieving a sealable bond with the metallized surface defined in the fill port 32. One non-limitative example of sealing the fill port 32 includes forming a plug 33 by hermetically sealing the fill port 32 via a soldering process. It is to be understood that sealing between the appropriate plug 33 and metallized fill port surface may occur by any suitable method known to the skilled artisan. In an embodiment, the plug 33 may be a photoresist material. Examples of photoresist materials include, but are not limited to polyimides, modified cresol resins, modified siloxanes, acrylic resins, novolak epoxies, polynorbornenes, PMMA derivatives (a non-limitative example of which includes one commercially available under the tradename PMGI from MicroChem Corp. located in Newton, Mass.), and photo-BCBs (a non-limitative example of which is commercially available under the tradename CYCLOTENE from The Dow Chemical Co. located in Midland, Mich.).

FIGS. 4A and 4B show that the second substrate wafer 14 and associated underbump 16 are in sealingly bonded contact with the first substrate wafer 12. The first substrate wafer 12 may be configured with one or more suitable adhesion promoting layer(s) 36 or localized regions to promote adhesion between the localized bond region 20 and the first substrate wafer 12. It is to be understood that the adhesion promoting layer(s) 36 may be selectively established on the inwardly oriented face 28 of the first substrate wafer 12 and/or on the upper inwardly oriented face 26 of the second substrate wafer 14. In an embodiment, the adhesion promoting layer(s) 36 may be established in a suitable pattern that permits orientation of the adhesion promoting layer(s) 36 over regions of the selected substrate wafer 12, 14 proximate to the breach cut walls 34, 34'.

Any suitable material that is compatible with the first substrate wafer 12 may be used for the adhesion promoting layer(s) 36. Examples of materials suitable for the adhesion promoting layer(s) 36 include, but are not limited to tantalum, gold, and the like. In a non-limitative example in which the first substrate wafer 12 is a silicon-based material, it is contemplated that the adhesion promoting layer(s) 36 may be made of any material that will be compatible with silicon microfabrication processes.

The adhesion promoting layer(s) 36 may be a single layer or a multilayer stack. Where a multilayer stack is employed, it is contemplated that the adhesion promoting layer(s) 36 will include a suitable silicate layer proximate to the first substrate wafer 12. Non-limiting examples of suitable silicates include at least one of TEOS, borosilicate, and the like. Metal or metal-compatible layers may be placed in overlying relationship thereto. Suitable metal compatible layers include materials such as tantalum, titanium, and the like. It is also contemplated that, in certain instances, various polymeric adhesion promoters may be advantageously employed. It is contemplated that the metal layer may be one that is compatible with the localized bond region 20 material. Non-limiting examples of such materials include aluminum, nickel, gold, and the like.

A non-limitative example of a stack suitable for use as an adhesion promoting layer 36 includes a tetraethylorthosilicate layer having a thickness ranging between about 1,000 and about 10,000 angstroms, a tantalum layer having a thickness ranging between about 1 and about 1,000 angstroms overlying the tetraethylorthosilicate layer, and an aluminum layer having a thickness ranging between about 0.5 μm to 2 μm overlying the tantalum layer.

Figure 5:
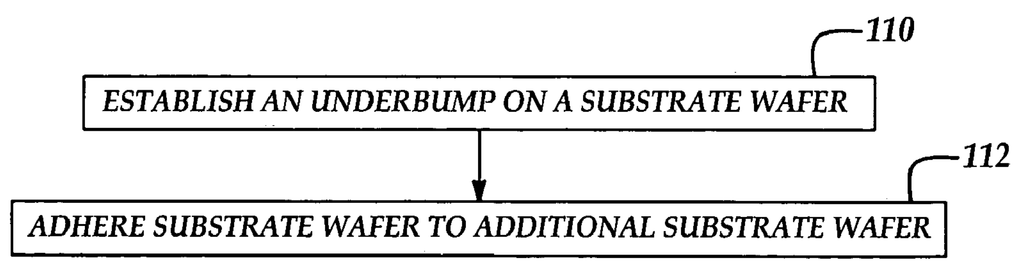
FIG. 5 is a process flow diagram of an embodiment of a method of producing a MEMS device package.

A microelectromechanical device package 10 as disclosed herein may be fabricated by the method broadly depicted in FIG. 5. In this embodiment, an underbump 16 is established on a first substrate wafer 12 as at reference numeral 110. After the underbump 16 has been established, the first substrate wafer 12 may be adhered/bonded to a second substrate wafer 14, as shown at reference numeral 112. It is contemplated that the first and second substrate wafers 12, 14, together with the established underbump 16, define a chamber 22 containing at least one microelectromechanical system 24 therein. The underbump 16 may be established by any suitable process, including, but are not limited to various deposition processes, patterning processes, etching processes and the like. It is contemplated that the underbump 16 may be composed of a standoff region 18 and a localized bond region 20 (a non-limitative example of which is an electroconductive material) deposited in overlying relationship to the standoff region 18.

Adherence or adhesion of the first substrate wafer 12 to the second substrate wafer 14 may occur in a manner such that the localized bond region 20 on the underbump 16 is brought into contact with the second substrate wafer 14. The localized bond region 20 may be processed in a manner such that a bonded relationship is formed between the localized bond region 20, the standoff region 18, and the first and second substrate wafers 12, 14. Where the localized bond region 20 has electroconductive characteristics, it is contemplated that the bond process may be a suitable anodic bonding process. The bond process may also be a suitable soldering process.

The standoff region 18 employed may be any material suitable for deposition on the first substrate wafer 12. Non-limiting examples of such materials include tetraorthosilicate glass, silica glass, phosphosilicate, polysilicon glass, borosilicate glass, titanium silicate glass, nickel and copper.

Where a soldering process is used, for example, a 320° C. (eutectic) gold/tin solder melt process, nickel having a melt temperature of 1453° C. and copper having a melt temperature of 1083° C. are suitable standoff metal materials. Similarly, other suitable metals having appropriate melting temperatures (as compared to the solder temperature) may be used.

Figure 6:
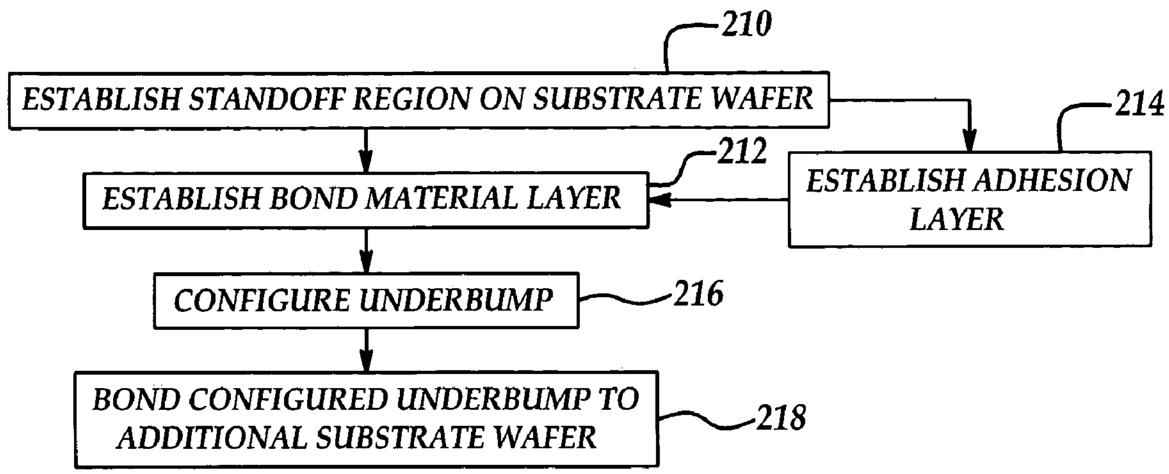
FIG. 6 is a process flow diagram of an embodiment of a method of producing a MEMS device package.

It is contemplated that an underbump 16 may be established on a substrate wafer 12, 14 by a suitable method. Referring to FIG. 6, the underbump 16 fabrication occurs with the establishment of a standoff region 18 (e.g. a dielectric material or a material having a higher melting temperature than the material used for the localized bond region 20) on the surface of a suitable substrate wafer 12, 14 as at reference numeral 210. Establishment may occur by any suitable method, including selective deposition as well as deposition with various patterning and etching processes. The standoff region 18 may have a sufficient thickness to yield a furnished underbump 16 (including the localized bond region 20) having a height ranging between about 3 μm and about 20 μm.

It is contemplated that a suitable localized bond region 20 made of at least one bond material layer may be established in overlying relationship with the standoff region 18 as at reference numeral 212. The bond material layer may be any suitable material capable of adhering to the underlying standoff region 18. The bond material may also be capable of forming a suitable sealed bond between the standoff region 18 and an additional substrate wafer. Suitable bond materials include, but are not limited to, high temperature anodic bond materials such as metals and metal alloys discussed previously. The bond material layer may be established by any suitable fabrication method, including, but are not limited to, selective deposition techniques as well as various deposition processes followed by patterning and etching. It is contemplated that the bond material layer will have an initial thickness appropriate to yield the localized bond region 20 sufficient to sealingly bond the underbump 16 and associated substrate wafer to an additional substrate wafer.

In order to establish the bond material layer(s) to the standoff region 18, a suitable adhesion layer may be interposed between the standoff region 18 and the bond material layer where desired and/or required, as shown at reference numeral 214. The adhesion layer may be established by any suitable method such as selective deposition or deposition followed by patterning and etching. Suitable adhesion materials are those compatible and amenable to the final fabrication process. Those include, but are not limited to, various alloys of tantalum, tin, and the like. Non-limiting examples of such alloys include tantalum aluminum, tin-silver alloys, and the like. Other suitable adhesion materials include, but are not limited to at least one of dielectric materials (for example, TEOS), nitride materials (for example, titanium nitride), and mixtures thereof.

As depicted in FIG. 6 at reference numeral 216, it is contemplated that the standoff region 18, localized bond region 20, and interposed adhesion layer will form a stack that may be configured into an underbump 16. Configuration of the underbump can occur by any suitable fabrication method. One such method contemplates masking the established stack with a suitable resist material in the desired and/or required underbump pattern. The stack may then be etched by a suitable etch process, either simultaneously or sequentially. In a sequential etch process, it is contemplated that the masked bond material layer(s) (which make up the localized bond region 20) may be etched in a suitable etch process followed by a mask and etch of the exposed standoff region 18.

Once the underbump 16 has been configured, the underbump 16 may be bonded to an additional substrate wafer as at reference numeral 218. Bonding may occur by suitable process, including but not limited to anodic bonding.

Figure 7:
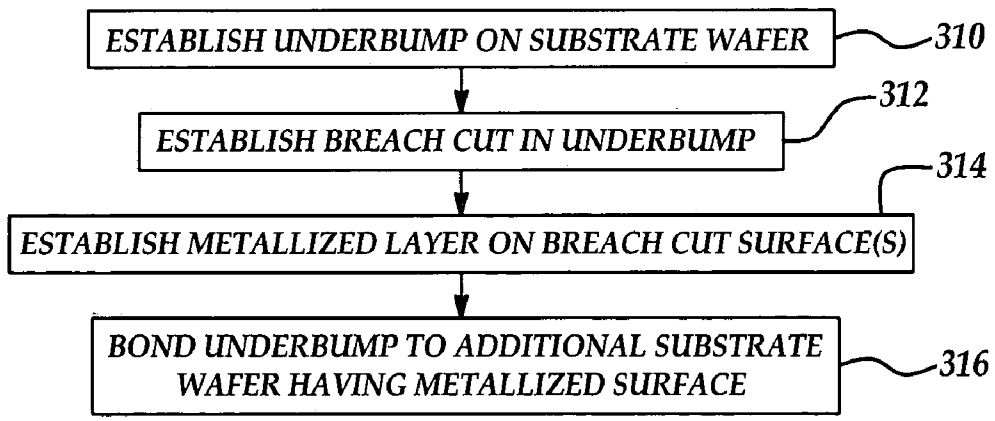
FIG. 7 is a process flow diagram of an embodiment of a method of fabricating a fill port.

FIG. 7 discloses a method for fabricating a MEMS package 10 having at least one adhesion promoting fill port 32 such as a fully metallized fill port 32. In an embodiment, an underbump 16 may be established (reference numeral 310). At least one breach cut 32' may then be established in the underbump 16 as at reference numeral 312. The breach cut 32' may be established by any suitable method. It is contemplated that the breach cut 32' may extend from an outer surface of the underbump 16 to an interior of a chamber 22 formed thereby.

The breach cut 32' establishment step may occur at any time prior to final assembly of the respective substrate wafers 12, 14. Once the breach cut 32' is established, an adhesion-promoting layer 36, such as a metallized layer, may be established on the surface of the breach cut 32' as at reference numeral 314. The adhesion promoting layer 36 may be established by any suitable deposition process such as metallization. It is contemplated that the breach cut 32' metallization establishment process may be integrated with the deposition of the localized bond region 20 described previously. Alternately, the adhesion promoting layer 36 may be established in a distinct fabrication step.

In order to achieve complete fill port 32 metallization, a suitable adhesion promoting layer 36 (e.g. metallized layer) may be established on at least a portion of the additional substrate wafer. The prepared underbump 16 may be bonded to the additional wafer having a complementary surface as at reference numeral 316.

Where desired and/or required, it is contemplated that the fabrication process as disclosed herein may include additional fabrication steps. Non-limiting examples of additional fabrication steps include establishment of a suitable protective layer on a wafer surface opposed to the underbump fabrication surface. The protective layer may be any material suitable for preserving desired surface characteristics of the wafer during fabrication of the underbump. The protection layer may be removed subsequent to fabrication of the underbump. Where desired, the protective coating may be replaced with at least one functional coating such as an antireflective coating layer.

In order to further illustrate the method disclosed herein, reference is made to the process flow diagrams outlined in FIGS. 8A through 8I and to the following discussion detailing a method of forming an embodiment of the package 10.

The method generally includes steps of fabricating an underbump 16 on the desired substrate wafer 12, 14 and then adhering the configured substrate wafer 12, 14 to an additional substrate wafer 14, 12, thus defining a chamber 22 therebetween.

Figure 8A:
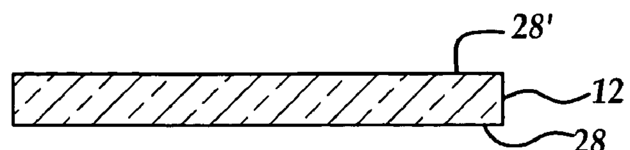
FIGS. 8A through 8I are cross-sectional schematic views of a build sequence of an embodiment of the method.
Figure 8B:
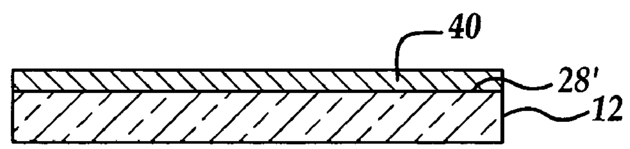
Figure 8C:
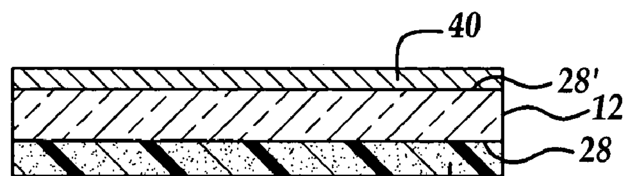
Figure 8D:
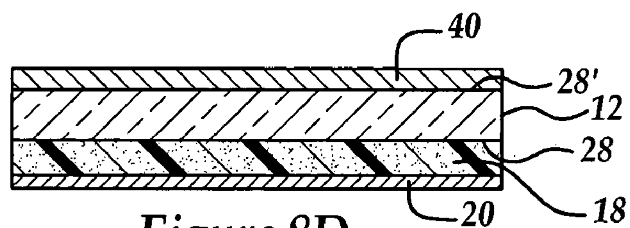

A first substrate wafer 12 is provided, as illustrated in FIG. 8A. It is to be understood that the first substrate wafer 12 may be composed of any suitable optical quality glass material. It is contemplated that the first substrate wafer 12 has an inward oriented face 28 and an outward oriented face 28', which are opposed to one another. A protective layer 40 may be established on the outward face 28' of the first substrate wafer 12 to act as protection for the first substrate wafer 12 during the subsequent fabrication steps. Some non-limitative examples of materials suitable for use in the protection layer 40 include various polysilicon compounds. Establishment may occur by any suitable process including but not limited to deposition followed by patterning and etching. Deposition may be accomplished by any suitable additive process.

After the protection layer 40 has been established, a standoff region 18 is established on the surface 28 of the first substrate wafer 12. The material employed in standoff region 18 is one that will form suitable underbump(s) 16 in the resulting package 10 (shown in FIG. 8I). The material may include at least one of tetraethylorthosilicate glass, silica glass, phosphosilicate, polysilicon glass, borosilicate glass, titanium silicate glass, polysilazane, metal-organic spin-on coatings, nickel, copper, and/or mixtures thereof. It is contemplated that any suitable deposition technique may be used to establish the standoff region 18. Some non-limitative examples of suitable deposition techniques include spin coating, chemical vapor deposition, and the like. The standoff region 18 as established has a thickness sufficient to provide a finished underbump 16 ranging between about 3 μm and about 20 μm.

A material layer suitable for formation of a localized bond region 20 may then be established on the standoff region 18. The localized (high-temperature) bond region 20 may include at least one material that acts as an adhesion layer and one material that acts as a bonding material. The adhesion material in the bond region 20 may be any suitable material, and in one embodiment is one of tantalum or a tantalum-containing compound. The bond region 20 generally contains a metal material, which is capable of anodic bonding. The bond materials in the localized bond region 20 include, but are not limited to, tin, nickel, gold, alloys thereof and/or mixtures thereof. It is contemplated that the adhesion material and the bond materials that make up the localized (high-temperature) bond region 20 may be deposited in a single layer or multiple layers and may include same or different metals throughout.

Figure 8E:
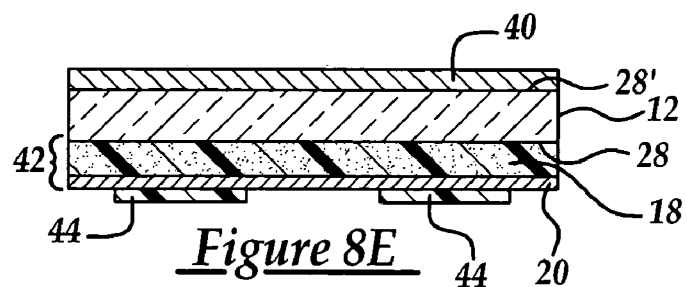

The standoff region 18 and localized bond region 20 (composed of one or more sublayers) make up a stack 42 that may be configured as desired and/or required. As shown in FIG. 8E, the stack 42 may be masked with at least one resist material 44. It is to be understood that any standard resist material 44 may be used to mask the stack 42. The localized (high-temperature) bond region 20 may be etched using any suitable etching process, such as various wet etch processes. It is contemplated that the various sublayers of the localized bond region 20 may be etched sequentially or simultaneously with each other. Suitable etching techniques are generally those that will selectively stop at the standoff region 18. It is to be understood that the etching process employed forms the underbump pattern, which may be any suitable size and/or shape as required and/or desired by a particular end use, including holding functional fluid/gas and/or MEMS devices.

Figure 8F:
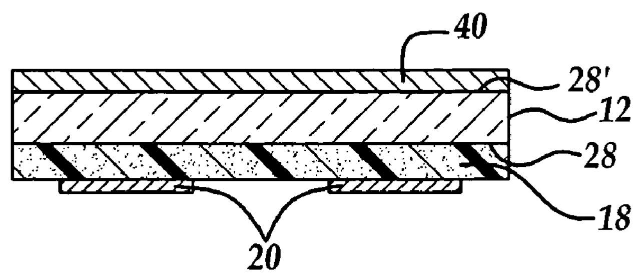
Figure 8G:
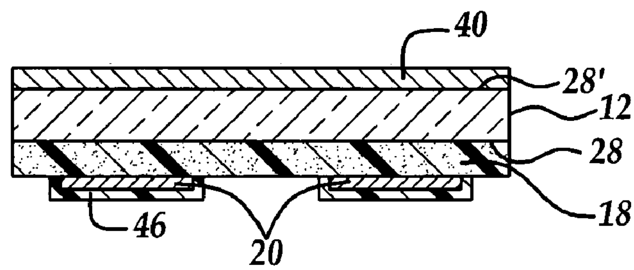

Once the localized bond region 20 has been etched (as depicted in FIG. 8F), the standoff region 18 may be masked and etched. It is contemplated that, where desired, the same resist material layer 44 used to mask the localized bond region 20 may also be used to mask the standoff region 18. In an alternate embodiment, the resist layer 44 may be stripped, and the standoff region 18 may be masked (using a different mask 46) and etched. It is contemplated that any suitable etching process may be used for the standoff region 18. Various dry etch processes (non-limitative examples of which includes plasma etch processes) may be advantageously employed. It may be desired that the etch process be selected such that the characteristics (such as optical quality) of the first substrate wafer 12 may be maintained if desired and/or required. Masking of the standoff region 18 is shown in FIG. 8G.

Figure 8H:
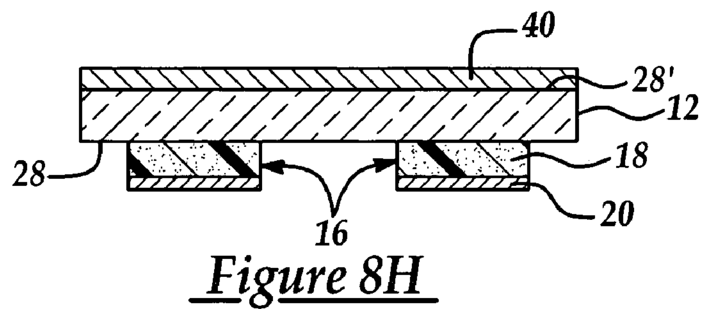

The mask 46 may be stripped from the resulting assembly by any suitable process to yield the configuration of FIG. 8H.

Figure 8I:
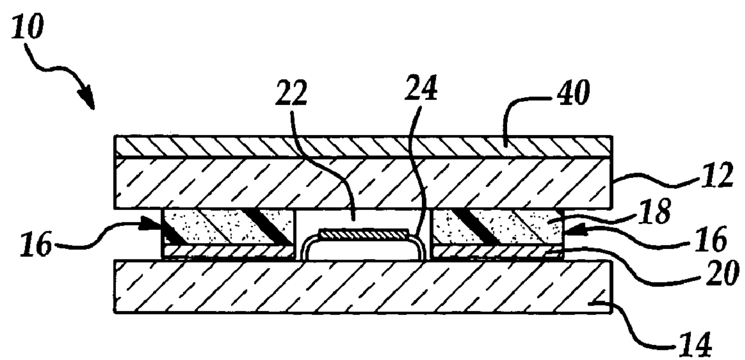

FIG. 8I illustrates the step of the method in which the first substrate wafer 12 having the underbump 16 established thereon is bonded to an additional/second substrate wafer 14. It is to be understood that the additional substrate wafer 14 may be any suitable substrate material including but not limited to silicon, semiconductor materials, and the like. The underbump 16 illustrated includes the standoff region 18 and the localized bond region 20.

A suitable MEMS device 24 may be positioned on the second substrate wafer 14 such that the MEMS device 24 is located in a chamber 22 defined by the first and second substrate wafers 12, 14 and the underbump 16 when the respective wafers 12, 14 have been adhered to one another. The chamber 22 may be adapted to contain fluid (in addition to or separate from the MEMS device 24) therein.

Figure 9A:
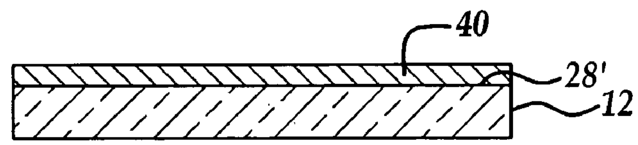
FIGS. 9A through 9I are cross-sectional schematic views of a build sequence of an embodiment of the method.
Figure 9B:
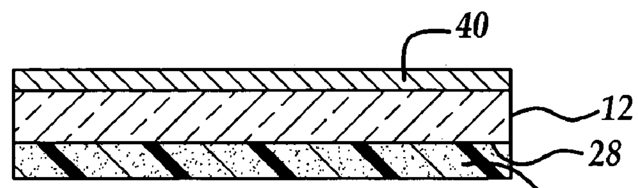

Referring now to FIGS. 9A through 9I, an alternate embodiment of the method for making package 10 is disclosed. A first substrate wafer 12 is provided. A protective layer 40 may be established on an outward face 28' of the first substrate wafer 12. A standoff region 18 may be established on an inwardly oriented face 28 of the first substrate wafer 12, which is opposed to the outward face 28' of the first substrate wafer 12 as illustrated in FIG. 9B. The protective layer 40 and the standoff region 18 may be established by any suitable fabrication method. It is contemplated that various deposition methods may be employed, including those previously described.

Figure 9C:
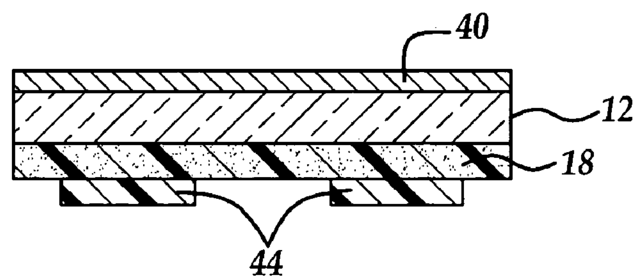
Figure 9D:
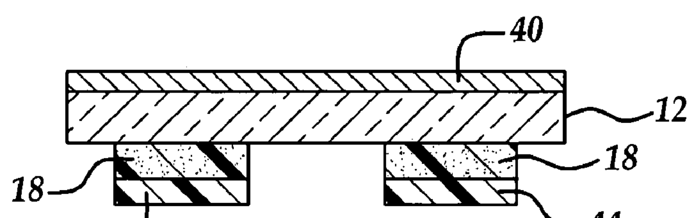

In this alternate embodiment of the method depicted in FIG. 9C, the standoff region 18 may be masked with a suitable resist material 44. The standoff region 18 may then be etched as desired and/or required. Etching may be accomplished by any suitable etch process including, but not limited to, dry etch processes. As illustrated in FIG. 9D, etching generally takes place prior to the deposition of any additional layers. After etching, the resist material 44 can be removed, thus forming the base of the underbump 16.

Figure 9E:
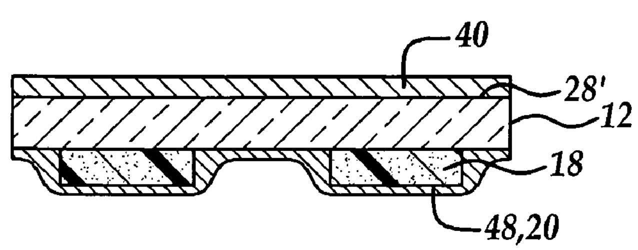

A localized bond region 20 may be established on the previously patterned and etched standoff region 18. The localized bond region 20 may be composed of a layer or layers of suitable bond materials. As depicted in the fabrication sequence in FIGS. 9A to 9I, the localized bond region 20 is composed of multiple layers established sequentially. As depicted in FIG. 9E, an adhesion layer 48 is established over the remaining portions of the standoff region 18 and exposed surfaces of inwardly oriented face 28 of the first substrate wafer 12. The adhesion layer 48 may be established by any suitable deposition process. Non-limiting examples of such processes include sputter deposition and the like. Suitable materials for the adhesion layer 48 include, but are not limited to, tantalum and various tantalum-containing compounds such as tantalum aluminum.

Figure 9F:
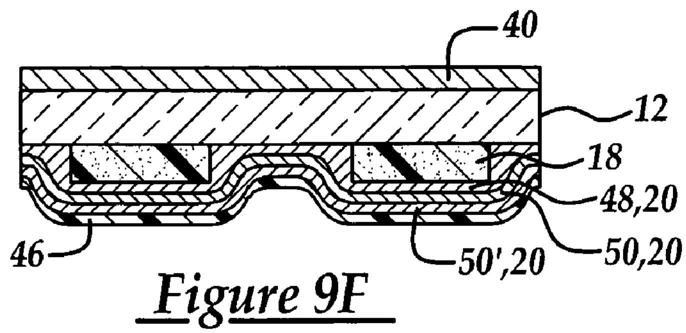

A bond material layer be established in overlying relationship to the adhesion layer 48 by a suitable deposition process such as sputtering or the like. The bond material layer is generally a metal layer containing at least one of gold, tin, nickel, silver, or the like. The bond material layer may be composed of multiple sublayers established sequentially in overlying relationship to one another. As illustrated in FIG. 9F, the bond material layer includes two sublayers 50, 50' that, for illustrative purposes, are composed of suitable tin/gold alloys. It is contemplated that other sublayer combinations and materials may be established to achieve the desired localized bond region 20.

Figure 9G:
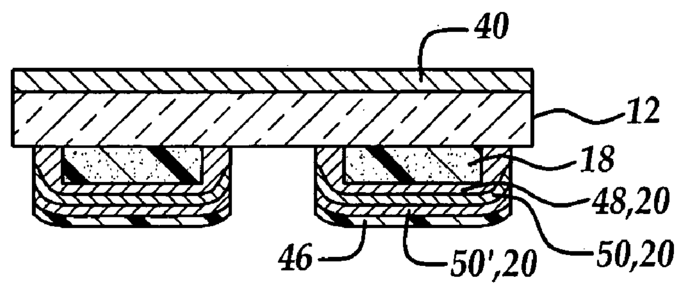
Figure 9H:
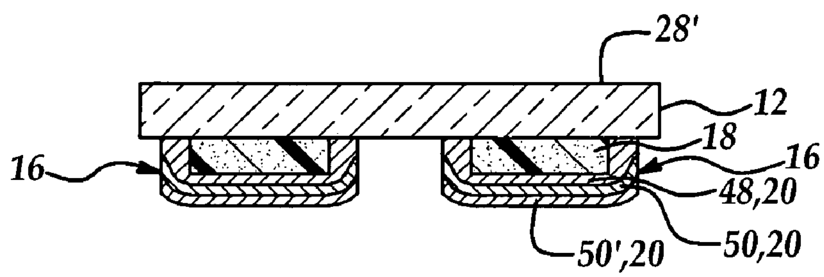

Once the various bond material layers 50, 50' have been established, the localized bond region 20 may be configured by any suitable patterning process. In the embodiment as illustrated in FIGS. 9F and 9G, a suitable mask 46 may be established by appropriate methods such as photolithographic deposition and the like. The resulting masked stack may be etched to configure the underbump 16. The mask 46 may be stripped as depicted in FIG. 9H, and the protective layer 40 removed by any suitable technique as desired and/or required.

Figure 9I:
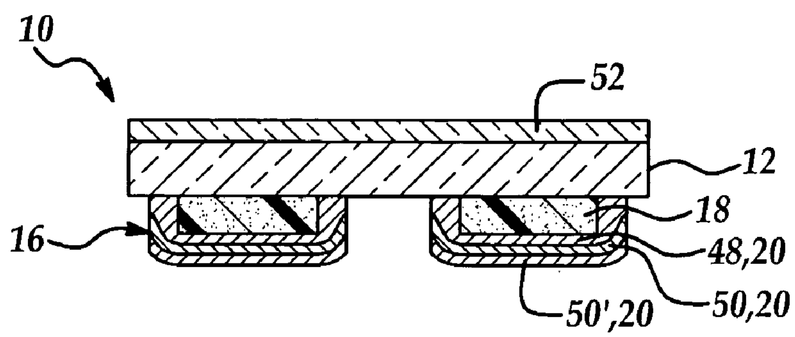

The method as illustrated may also include the optional step of establishing an anti-reflective coating 52 on the outward face 28' of the first substrate wafer 12 (as shown in FIG. 9I). It is to be understood that the anti-reflective coating 52 may be composed of any suitable material capable of providing the desired and/or required anti-reflective characteristics. A second substrate wafer (not shown) may be adhered to the fabricated underbumps 16 of the assembly illustrated in FIG. 9I in the manner discussed previously.

The package 10 may offer many advantages including, but not limited to the following. The standoff region 18 may be made of a dielectric material, which may advantageously match the silicon wafer and the glass wafer such that stress caused by the coefficients of thermal expansion, which were previously mismatched, may be reduced. The thin layers used for the localized bond region 20 may advantageously result in less waste of materials and the use of generally less expensive materials. Still further, fast deposition techniques may also result in quicker fabrication of the device.

It is to be understood that the various embodiments of the packages 10 may be used in a variety of applications including, but not limited to, spatial light modulators, integrated circuits, display devices and various other microelectronic system packaging devices.

Figure 10:
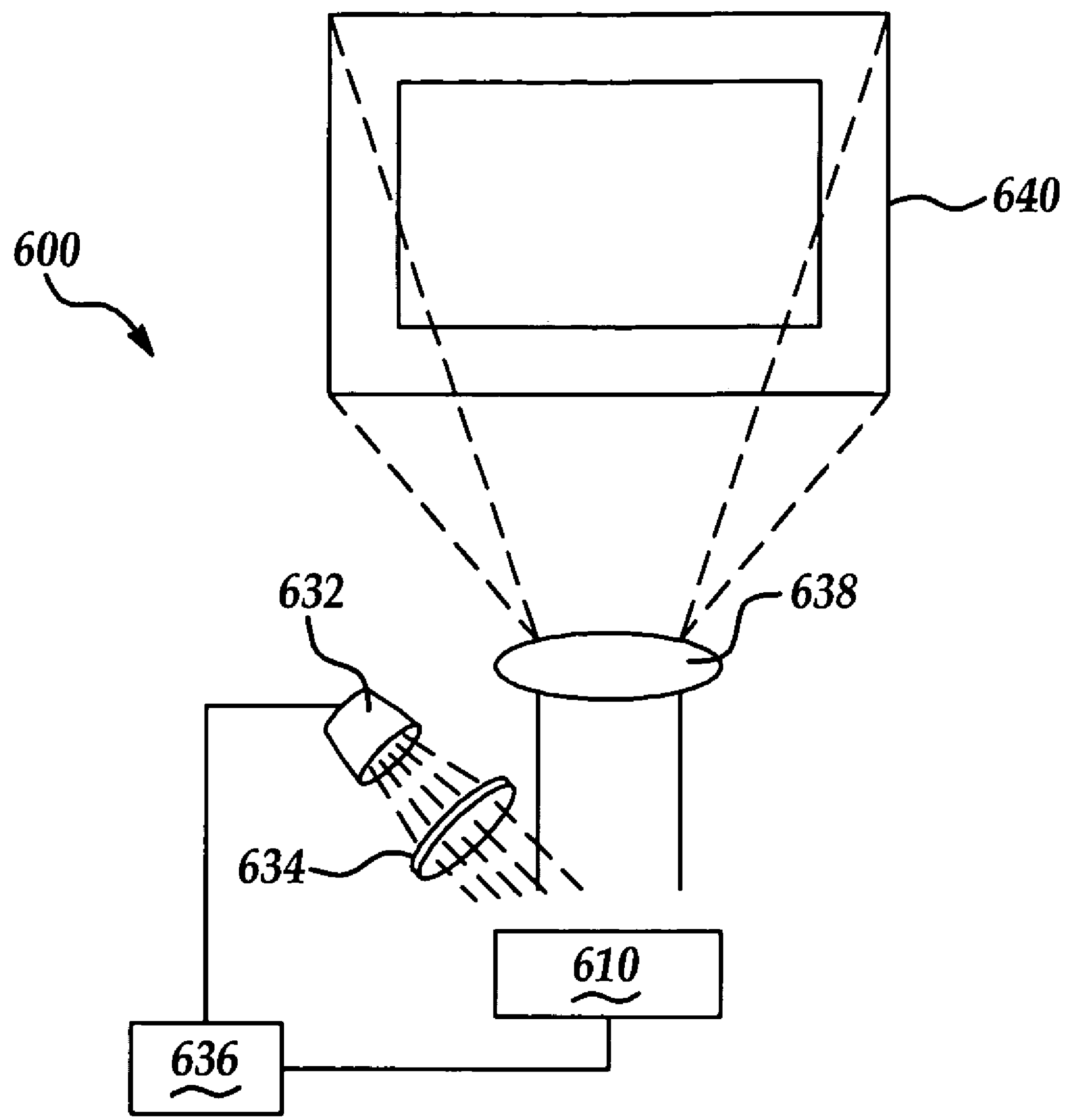
FIG. 10 is a schematic view of a display device utilizing an embodiment of the microelectromechanical system and package.

A device 600 utilizing a microelectromechanical device package 10 formed by an embodiment of the method disclosed herein is a spatial light modulator as depicted in FIG. 10. It is contemplated that the display device 600 may include at least one MEMS device contained in a package 10, for example, in a light modulation device 610. As depicted in FIG. 10, light from light source 632 is focused on a light modulation device 610 by lens 634. Although shown as a single lens, lens 634 is typically a group of lenses, integrators, and mirrors that together focus and direct light from light source 632 onto the surface of the light modulation device 610. Image data and control signals from controller 636 are written onto a suitable SRAM cell, DRAM cell, or the like, associated with each light modulation device 610 incorporating the microelectromechanical device disclosed here in device 610. The data in these associated cells may cause some of the MEMS devices to shift to an "on" state. Devices that are shifted to an "off" state may reflect light away from projection lens 638. While multiple devices are shifted to an "on" position to reflect light to projection lens 638, a single device is shown for simplicity. Projection lens 638 focuses the light modulated by the light modulation device 610 onto a single image plane or screen 640.

While several embodiments of the invention have been described in detail, it will be apparent to those skilled in the art that the disclosed embodiments may be modified. Therefore, the foregoing description is to be considered exemplary rather than limiting.

What is claimed is:

1. A method for fabricating an electronic device package structure comprising the steps of:

establishing an underbump on a first substrate wafer, the underbump composed of a localized bond region and standoff material having a face distal to the first substrate wafer, the localized bond region deposited on the distal face of the standoff material;

preparing at least one breach cut in the underbump; and then adhering the first substrate wafer having the underbump positioned thereon to a second substrate wafer, thereby defining a chamber adapted to contain the electronic device therein;

wherein the breach cut extends from an exterior surface of the underbump to the chamber.

2. The method of claim 1 wherein establishing the underbump comprises:

establishing the standoff material on the first substrate wafer;

depositing at least one bond material layer over the standoff material, thereby forming a stack; and configuring the stack into an underbump.

3. The method of claim 2, further comprising the step of establishing an adhesion layer over the standoff material prior to establishing the at least one bond material layer.

4. The method of claim 3 wherein the adhesion layer is selected from tantalum, a tantalum-containing compound, and combinations thereof, and the at least one bond material layer includes at least one layer containing tin and at least one layer containing gold.

5. The method of claim 1 wherein adhering comprises one of anodically bonding and soldering the localized bond region of the underbump to the second substrate wafer.

6. The method of claim 1 wherein the material is selected from tetra-orthosilicate glass, silica glass, phosphosilicate, polysilicon, borosilicate glass, titanium silicate glass, polysilazane, tetraethyl-ortho-silicate glass, metal-organic spin-on coatings, nickel, copper, and mixtures thereof.

7. The method of claim 1 wherein the localized bond region is a metal material, and the method further comprises depositing the metal material on the underbump and the breach cut prior to adhering the underbump to the second substrate wafer.

8. The method of claim 1, further comprising hermetically sealing the breach cut by soldering after adhering the underbump to the second substrate wafer.

9. The method of claim 1, further comprising depositing a protective layer on the first substrate wafer, the protective layer positioned on a face of the first substrate wafer opposed to the underbump, the protective layer deposited prior to establishing the underbump.

10. The method of claim 9 wherein the first substrate wafer is optical quality glass and the standoff material is selected from tetraethyl orthosilicate, polysilicon glass, and combinations thereof.

11. A method for fabricating an electronic device package structure comprising the steps of:

establishing a standoff material on a first substrate wafer;

establishing an adhesion layer over the standoff material, wherein the adhesion layer is selected from tantalum, a tantalum-containing compound, and combinations thereof;

then depositing at least one bond material lever over the adhesion layer, thereby forming a stack, wherein the at least one bond material layer includes at least one layer containing tin and at least one layer containing gold;

configuring the stack into an underbump by:

masking the stack with at least one resist material;

sequentially etching the adhesion layer and the at least one bond material layer into an underbump pattern;

masking the standoff material after the at least one bond material layer has been etched; and etching the standoff material into the underbump pattern; and adhering the first substrate wafer having the underbump positioned thereon to a second substrate wafer, thereby defining a chamber adapted to contain the electronic device therein.

12. A method for fabricating an electronic device package structure comprising the steps of:

establishing a standoff material on a first substrate wafer;

depositing at least one bond material layer over the standoff material, thereby forming a stack;

configuring the stack into an underbump by:

masking the stack with at least one resist material;

etching the at least one bond material layer into an underbump pattern;

masking the standoff material after the at least one bond material layer has been etched; and etching the standoff material into the underbump pattern; and adhering the first substrate wafer having the underbump positioned thereon to a second substrate wafer, thereby defining a chamber adapted to contain the electronic device therein.

13. A method for fabricating an electronic device package structure comprising the steps of:

establishing an underbump on a first substrate wafer, the underbump composed of a localized bond region deposited in overlying relationship to a standoff material;

adhering the first substrate wafer having the underbump positioned thereon to a second substrate wafer, thereby defining a chamber adapted to contain the electronic device therein;

depositing a protective layer on the first substrate wafer, the protective layer positioned on a face of the first substrate wafer opposed to the underbump, the protective layer deposited prior to establishing the underbump;

removing the protective layer subsequent to establishing the underbump; and depositing an anti-reflective coating an the face of the first substrate wafer after removing the protective layer.

* * * * *